United States Patent [19]
Reni et al.

[11] Patent Number: 5,352,968
[45] Date of Patent: Oct. 4, 1994

[54] BATTERY CHARGE STATE DETERMINATION

[75] Inventors: Daniele Reni, Provo, Utah; Michael F. Culbert, Boulder Creek, Calif.

[73] Assignee: Apple Computer, Inc., Cupertino, Calif.

[21] Appl. No.: 890,069

[22] Filed: May 28, 1992

[51] Int. Cl.$^5$ ............ G01N 27/27; G01N 27/04
[52] U.S. Cl. ............ 320/35; 320/48; 324/430; 324/431
[58] Field of Search ............ 320/31, 35, 36, 39, 320/40, 48; 324/430, 431

[56] References Cited

U.S. PATENT DOCUMENTS

| | | | |
|---|---|---|---|
| 3,940,679 | 2/1976 | Brandwein et al. | 320/35 |
| 3,959,707 | 5/1976 | Stephens | 320/39 |
| 4,308,492 | 12/1981 | Mori et al. | 320/35 |
| 4,308,493 | 12/1981 | Köthe et al. | 320/35 |
| 4,377,787 | 3/1983 | Kikuoka et al. | 324/431 |
| 4,382,221 | 5/1983 | Reynolds | 320/35 |
| 4,423,378 | 12/1983 | Marino et al. | 324/430 |
| 4,667,143 | 5/1987 | Cooper et al. | 320/35 |
| 4,725,784 | 2/1988 | Peled et al. | 320/48 |
| 4,843,299 | 6/1989 | Hutchings | 320/31 |
| 4,912,416 | 3/1990 | Champlin | 324/430 |
| 5,162,741 | 11/1992 | Bates | 324/431 |
| 5,237,257 | 8/1993 | Johnson et al. | 320/48 |

Primary Examiner—Steven L. Stephan
Assistant Examiner—Thomas M. Dougherty
Attorney, Agent, or Firm—Robert T. Martin

[57] ABSTRACT

Method and apparatus for accurately determining the charge state of a battery is disclosed. The charge state is derived from the battery voltage, which is corrected for errors introduced by temperature and series resistance. Error from series resistance is minimized by either making an open circuit voltage measurement, or by making a plurality of voltage measurements under known load conditions, calculating the series resistance from these measurements, and calculating an equivalent open circuit voltage, compensating for the voltage drop caused by the series resistance of the battery. Errors introduced by temperature induced shifts in battery voltage are corrected by reading the battery temperature and correcting the battery voltage to a reference temperature. The battery voltage corrected for temperature and series resistance effects is used to compute charge state by table look up or algebraically.

6 Claims, 7 Drawing Sheets

$VB = V1 + RE \cdot I1$       $VB = V2 + RE \cdot I2$ $V1 + RE \cdot I1 = V2 + RE \cdot I2$ $RE = (V1-V2)/(I2-I1)$

BATTERY CHARGE STATE DETERMINATION

BACKGROUND OF THE INVENTION

The present invention relates to apparatus for determining the charge state of batteries, particularly nickel cadmium or nickel metal hydride rechargeable batteries.

Batteries, such as alkaline, nickel cadmium, nickel metal hydride, and lead acid, are used in a wide range of devices from flashlights to portable computers. In applications such as powering portable computers, the user is keenly interested in knowing how much operating time remains and when the battery must be either recharged or replaced. This information can be derived from the charge state of the battery.

Batteries are complex electrochemical devices which have characteristics that make the accurate determination of their charge state difficult. Charge and discharge characteristics of batteries are not linear with respect to battery voltage, temperature, and current. Batteries have an internal series resistance which results in a voltage drop under load. The battery voltage also varies with temperature, although this temperature variation is more noticeable with certain battery types than with others. These characteristics of the battery may vary with the charge state and over the life of the battery.

Since the voltage of a battery drops as the battery discharges, one method of measuring charge state is to measure the battery voltage and estimate the charge state from that measured voltage. Such a measurement will be inaccurate due to the voltage drop caused by the internal series resistance of the battery if the measurement is made under load. For some battery types, especially nickel-cadmium batteries, the battery voltage change with temperature, and the nonlinearity of battery voltage over time also makes simple measurements inaccurate.

What is needed is a method for accurately determining the charge state of a battery that takes into account the nonlinearity of battery voltage over time, compensates for battery voltage change due to temperature, and compensates for the internal resistance of the battery.

SUMMARY OF THE INVENTION

The charge state of a battery is determined by measuring or calculating an open circuit voltage for the battery to minimize error introduced by the internal series resistance of the battery and by correcting this open circuit voltage for temperature variations dependent on battery type. This corrected voltage is used to either calculate or look up in a table the charge state of the battery. This process compensates for internal resistance of the battery, nonlinearity of battery voltage over time, and change in battery voltage with respect to temperature. The open circuit voltage of the battery is measured by disconnecting it from the load for a period of a few microseconds while the measurement is made. Alternatively, the open circuit voltage of the battery is calculated by making a plurality of voltage measurements under known current load conditions, calculating the series resistance from these voltage measurements and their known currents, and compensating the battery voltage for the voltage drop introduced by the calculated series resistance. Because the voltage measurement is either open circuit, or the open circuit equivalent, changes in the series resistance of the battery as it ages are accommodated. Errors introduced by temperature induced shifts in battery voltage are corrected by reading the battery temperature and correcting the battery voltage to a reference temperature. The battery voltage corrected for temperature and series resistance effects is used to compute charge state by table look up or algebraically.

The present invention thus accurately determines the charge state of a battery, compensating for the internal series resistance of the battery, nonlinearity of voltage over time, and for the battery temperature. The invention is able to provide this accurate determination for different battery types. The invention may be part of a computer operated device or embedded in the battery pack of a computer operated device.

Other objects, features and advantages of the present invention will become more fully apparent from the following detailed description of the preferred embodiment, the appended claims and the accompanying drawings.

DETAILED DESCRIPTION OF THE INVENTION

Figure 1:
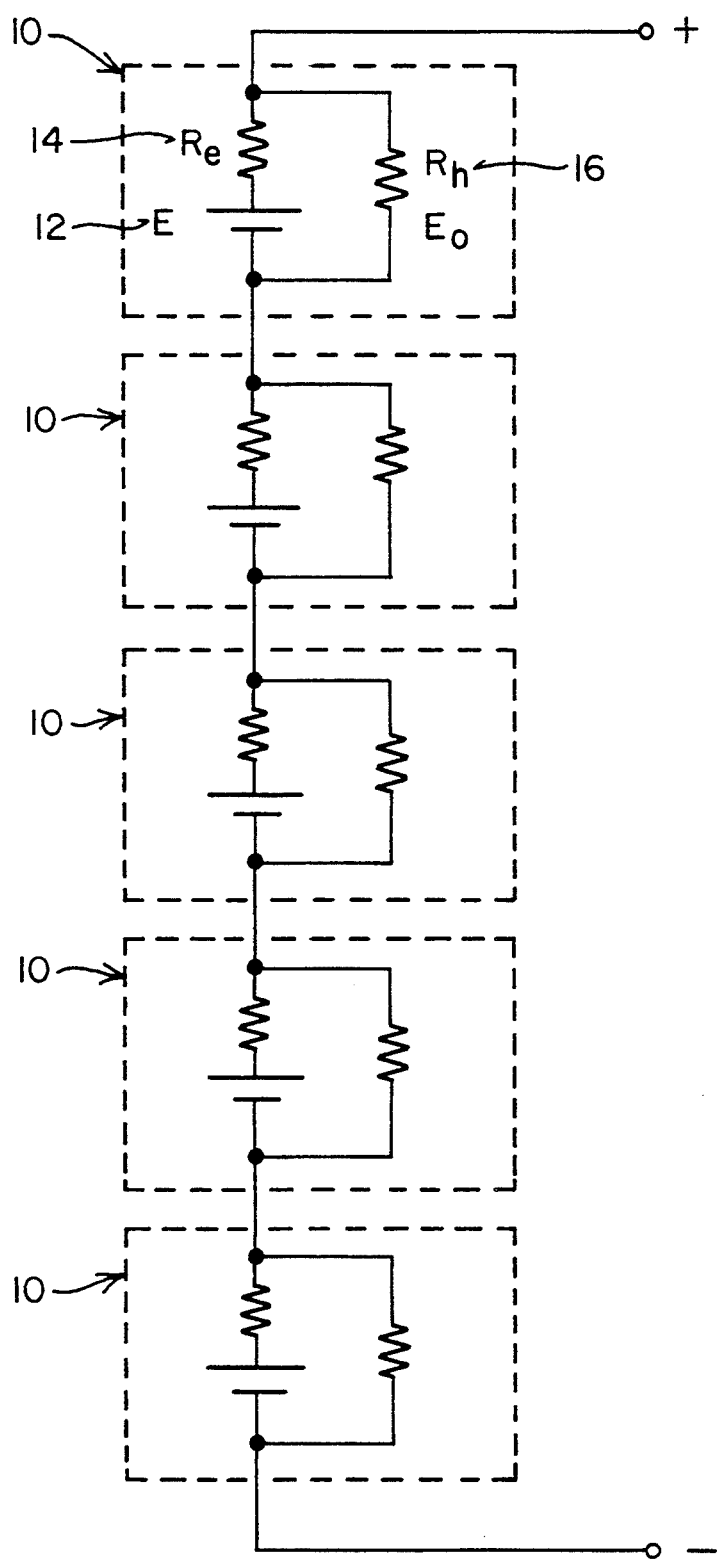
FIG. 1 is an equivalent circuit for a typical battery.

FIG. 1 is an equivalent circuit for a battery such as a nickel-cadmium battery. A battery is comprised of a number of cells 10 connected in series. Each cell 10 with output voltage $E_o$ is represented as a voltage source 12 in series with an equivalent series resistance 14, in parallel with a self-discharge resistance 16. Representing the output of the voltage source 12 as E, the series resistance 14 as $R_e$, and the load current as I, the output voltage of the cell is equal to:

$$E_o = E - I \cdot R_e \qquad \text{(Eq. 1)}$$

This voltage drop due to series resistance 14 increases with the load current. The effect of self-discharge resistance 16 $R_h$ is that of a continuous load discharging the cell over time. These characteristics of the battery change with temperature, with charge state, and over the life of the battery.

For example, if at 25° C. a fully charged nickel cadmium cell measures 1.54 volts, at 40° C., the same fully charged nickel cadmium cell would measure approximately 1.40 volts. Given this wide voltage shift depending on the temperature of the cell, open circuit cell voltage alone is an inaccurate predictor of remaining capacity. The voltage of the battery over time, especially in nickel cadmium cells, is non linear. This nonlinearity is especially prominent as the battery charge approaches zero; the battery voltage falls off very rapidly. The effect of making voltage measurements under load, introducing a voltage drop due to series resistance, further increases the error. In a typical A size nickel-cadmium cell, the series resistance is approximately 3 to 5 milliOhms (mΩ) in a new cell; this series resistance produces a voltage drop of 3 to 5 milliVolts (mV) under a high load, the equivalent of a wide temperature shift. As the cell ages, this series resistance increases to approximately 10 mΩ for a useful A size cell; as the cell exceeds its useful life, this series resistance increases substantially.

The present invention operates to minimize errors introduced by internal series resistance, non linearity of battery voltage, and temperature shift in determining remaining capacity of a battery. Error introduced by series resistance is minimized in one of two ways. First, measuring the battery voltage under minimum or no load minimizes the effect of series resistance on the measurement. Second, by making multiple battery voltage measurements under known current loads, the different voltages and currents are used to calculate the equivalent series resistance of the battery. By using the offset voltage caused by this series resistance, the equivalent open circuit voltage of the battery can be calculated. Error introduced by temperature is corrected by measuring the battery temperature and normalizing the measured voltage to a known temperature. Remaining capacity is then calculated from this normalized voltage. Calculating capacity from a lookup table compensates for the nonlinear nature of the battery voltage.

Figure 2:
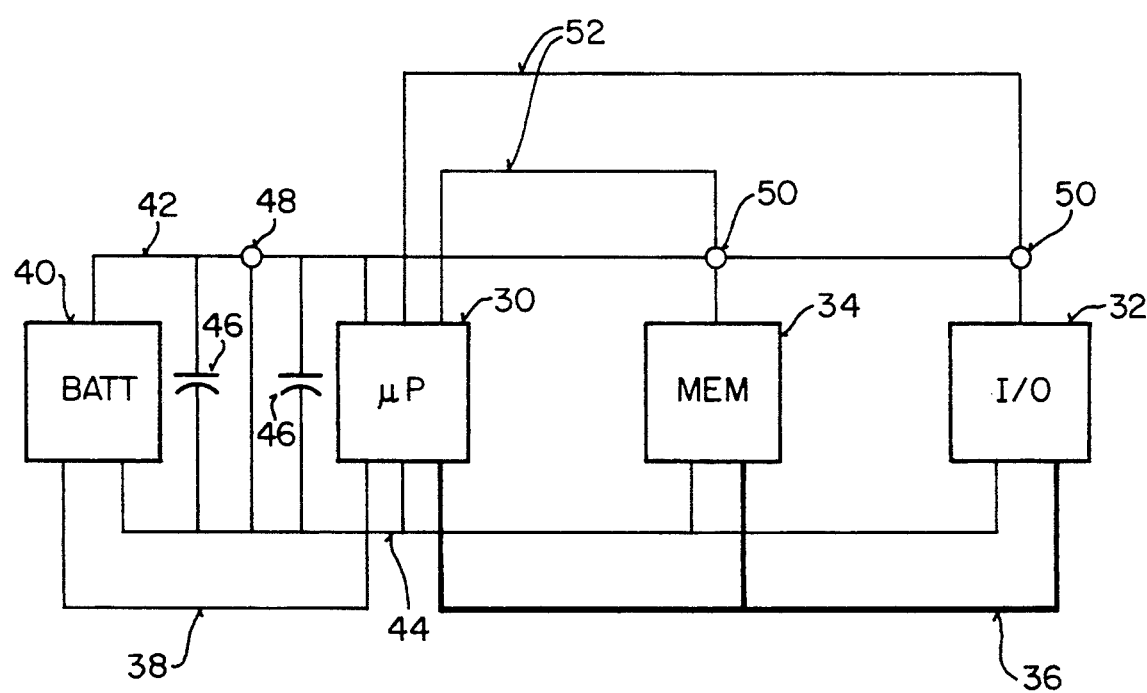
FIG. 2 is a block diagram of a first embodiment of the present invention.

FIG. 2 is a block diagram of the first embodiment of the present invention. A typical computer based device incorporates a central processing unit 30 connected to input/output devices 32 and memory 34 via data and control bus 36. Power is supplied by battery system 40, which is shown in greater detail in FIG. 3. Battery system 40 supplies power via supply rails 42 and 44. Battery system 40 is followed by storage capacitors 46 and regulator 48. Regulator 48 is preferably a high efficiency switching type. Central processing unit 30 communicates via control lines 38 with battery system 40 to request and receive battery charge state information. Battery system 40 contains its own microprocessor to measure and calculate the battery state and return this information to central processing unit 30 in the main device. In battery powered computer based devices it is common to provide power to subsystems only when they are in use as a power saving technique. FIG. 2 shows this as field effect transistor switches 50. Under control of CPU 30 via control lines 52 power is supplied only to those subsystems that are in use. For example, if an input/output device such as a hard disk drive is not in use, power to it can be removed by CPU 30 opening the corresponding power switch 50 via control line 52, saving considerable power, until the disk drive must be used again. In this first embodiment, battery system 40 is a battery pack that may be removed from the overall device.

Figure 3:
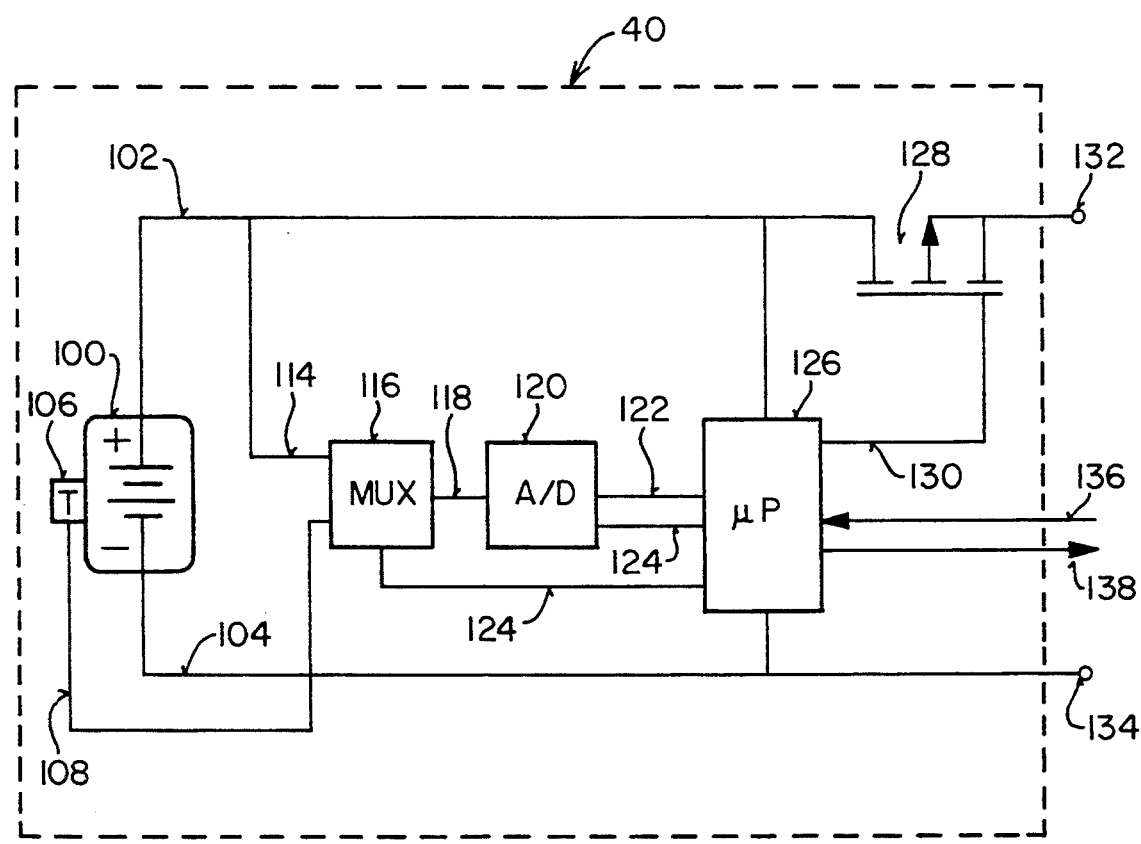
FIG. 3 is a detailed diagram of the first embodiment of the present invention.

FIG. 3 is a detailed schematic diagram of the battery system 40 of FIG. 2. The circuitry of this embodiment may be entirely enclosed within a removable battery pack. In response to a request on line 136 to measure the charge state of battery 100, microprocessor 126 returns the state of battery 100 via lines 134 to the requesting device. Battery 100 provides power for the device through positive supply rail 102 and negative supply rail 104. Battery temperature is measured by temperature sensor 106, which is mounted in close proximity to battery 100. Line 108 connects the output of temperature sensor 106 to analog multiplexer 116. Analog multiplexer 116 selects either battery temperature input 108 or battery voltage input 114 under control of microprocessor 126 and sends this signal 118 to analog to digital converter 120. Analog to digital converter 120 converts the analog input signal 118 into a digital signal 122 under control of microprocessor 126. Digital data 122 representing the selected signal is send to microprocessor 126. Microprocessor 126 controls analog multiplexer 116 and analog to digital converter 120 via control lines 124. Microprocessor 126 also controls field effect transistor switch 128 via gate line 130, providing switched power to the remainder of the device via positive supply line 132 and negative supply line 134.

During voltage measurements, microprocessor 126 opens power transistor switch 128 via gate line 130, disconnecting the load from battery 100. Removing the load during the few microseconds required to make the voltage measurement is essential to minimizing the effect of the equivalent series resistance of the battery. When the voltage measurement is completed, microprocessor 126 closes field effect transistor switch 128 via gate line 130, restoring battery power to the load connected at terminals 132 and 134.

Filter capacitors 46 (see FIG. 2) on both input and output of regulator 48 provide sufficient energy storage to power the remainder of the computer system for the few microseconds in which battery power is disconnected for the voltage measurement. For example, for a 150 micro farad filter capacitor and a 500 milliamp load, a 30 microsecond interruption will result in a voltage drop of around 150 milliVolts. Since the measurement of battery capacity is under control of central processing unit 30 of FIG. 2, it can take steps to reduce the current consumption at the time the measurement is made. For example, central processing unit 30 can wait for input/output devices to be idle and in an low power consumption state before initiating battery capacity measurement.

Figure 4:
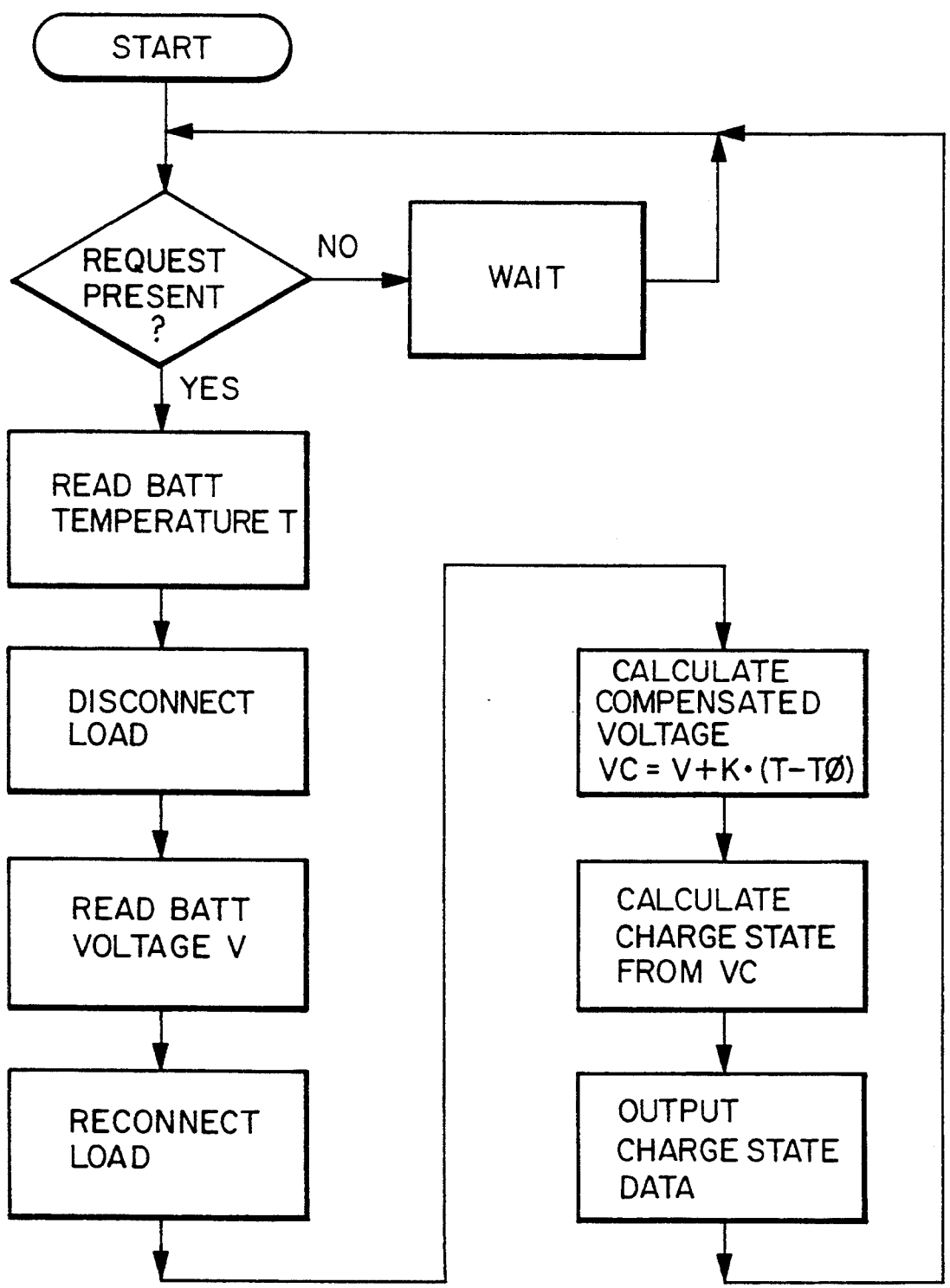
FIG. 4 is a flow chart of the first embodiment of the present invention.

The flow chart which comprises FIG. 4 illustrates the steps needed to process temperature and voltage data to calculate the charge state of battery 100 (FIG. 3) during discharge. At the beginning of the measurement cycle, microprocessor 126 checks for a request. If a request is not present, microprocessor 126 waits for a short period and checks request line again. Once a request is present, the battery temperature t is read, the load is disconnected, battery voltage V is read, and the load reconnected. The sequence of steps in reading battery temperature and voltage is not critical as long as the load is disconnected prior to reading battery voltage to minimize the effect of internal series resistance. Disconnecting and reconnecting the load immediately before and after the voltage measurement minimizes the time the battery is disconnected from the remainder of the power system. This time should be kept to under 100 microseconds to keep within the regulation range of regulator 48.

Once battery temperature t and no load battery voltage V are measured, the battery voltage V is corrected for temperature. In this embodiment, the compensated battery voltage VC is calculated as:

$$VC = V + k \cdot (t - t0) \qquad \text{(Eq. 2)}$$

where V is the no load battery voltage, t is the battery temperature, t0 is a reference temperature, commonly 25° C., and k is a constant which depends on the battery type. For nickel-cadmium batteries, which have a voltage shift of between 20 and 30 milliVolts per degree C., constant k is 0.02 to 0.03 times the number of cells in series in the battery, since each cell in series contributes its own voltage shift. The value for k may be determined simply by measuring the open circuit voltage of fully charged batteries at different temperatures. This value will be different for different types and sizes of batteries. The value of k can be measured and averaged over a large number of batteries of the same type and stored in read only memory of the battery pack's microprocessor, or the value of k can be determined for each individual battery pack and programmed into that battery pack's microprocessor for an individualized, more accurate calculation. This determination could be made as part of an initial diagnostic at the start of a charge cycle to minimize errors over the life of the battery.

Once the temperature corrected open circuit voltage VC has been calculated, this value is used to calculate the charge state of the battery. This calculation may be made through table lookup or through algebraic computation. In the table lookup approach, a table of values is stored in microprocessor 126's memory corresponding to different charge levels. Voltage VC is compared to the table entries until an entry is found that is lower than VC; this gives the charge level of the battery. In the preferred embodiment, a 20 entry table resolves charge level to the nearest 5%. This table compensates for nonlinearities in the battery voltage over time. Separate tables must be used for charge and discharge phases.

As an alternative to table lookup, a polynomial approximation can be used. Because of the nonlinearities in the discharge curve of nickel-cadmium cells, a fourth or fifth order polynomial is needed. Depending on the computational power of the microprocessor used, and the memory space available, the lookup table approach may be more applicable than the polynomial approximation. The table lookup approach is good in simple microprocessors that do not have the instructions for performing multiplication. The polynomial approach requires less memory space for constants than does the lookup table, but requires more computational resources to evaluate.

For either the table lookup or polynomial approximation, data must be collected to associate particular voltages with particular charge states at a specified temperature. A battery of the type to be used is fully charged, and allowed to stabilize at a known reference temperature, 25° C. in the preferred embodiment. This reference temperature is maintained during the measurement process by placing the battery in a controlled temperature environment. The battery is then discharged into a constant current load. Voltage measurements are taken in equal units of time, so that a recording is made tracking the expenditure of equal amounts of energy per measurement. This discharge process is allowed to continue until the battery is fully discharged. Next, the data is analyzed and a voltage cutoff point is chosen. This is the voltage level at which the battery is considered fully discharged. In nickel cadmium cells, this voltage is approximately 1.1 volts per cell at 25° C. Discharge below this level can lead to cell damage or reduced cell life. This cutoff point represents 100% of the energy of the battery. Since the data recorded represents equal amounts of energy expenditure, voltage levels for other energy levels can be easily determined. In practice this data is collected over a number of batteries of the same type from the same manufacturer and the data averaged.

As the battery characteristics are stored in the microprocessor in the battery system, different battery chemistries with different characteristics, such as nickel cadmium, nickel hydride, or lead acid may be used with no changes required in the main unit operated by the battery system.

In the implementation of this first embodiment, temperature may be measured through well known techniques, which include measuring the resistance of a temperature dependent resistor, or by measuring the voltage drop across one or more semiconductor junctions. Power switching may be accomplished through the use of known power field effect transistor switches, such as the IRF9230 or IRFU9020 manufactured by Siliconix Incorporated, and International Rectifier Corporation. These power transistors have a resistance in the on state of less than 1 Ohm, and a resistance in the off state of several million Ohms. The multiplexer, analog to digital converter, and microprocessor may be implemented as a single application specific integrated circuit to reduce both physical size and power consumption, or these elements may be implemented using separate devices. Low power CMOS microprocessors such as those in the 68HC05 family from Motorola Semiconductor may be used. An analog to digital converter such as the AD7880 from Analog Devices may be used.

Figure 5:
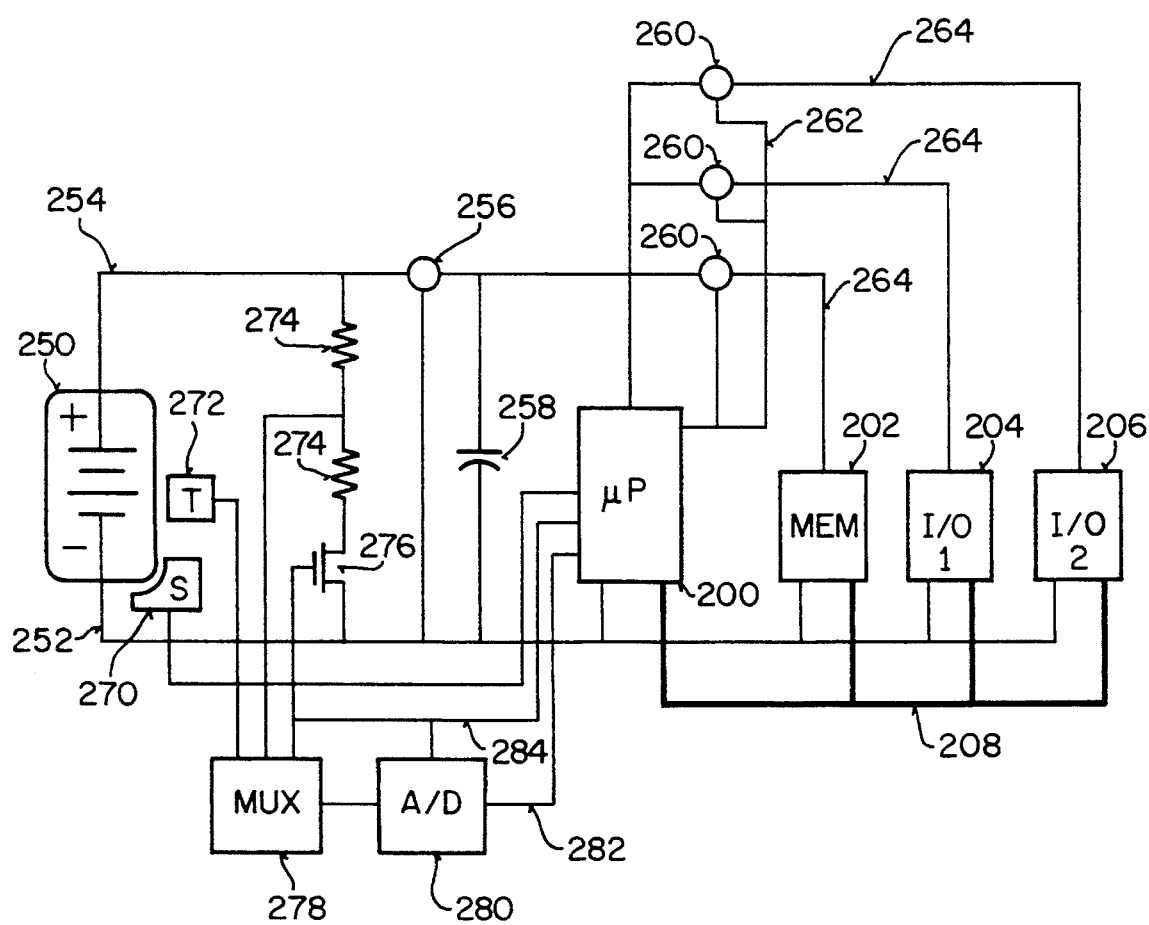
FIG. 5 is a diagram of a second embodiment of the present invention.
Figure 6:
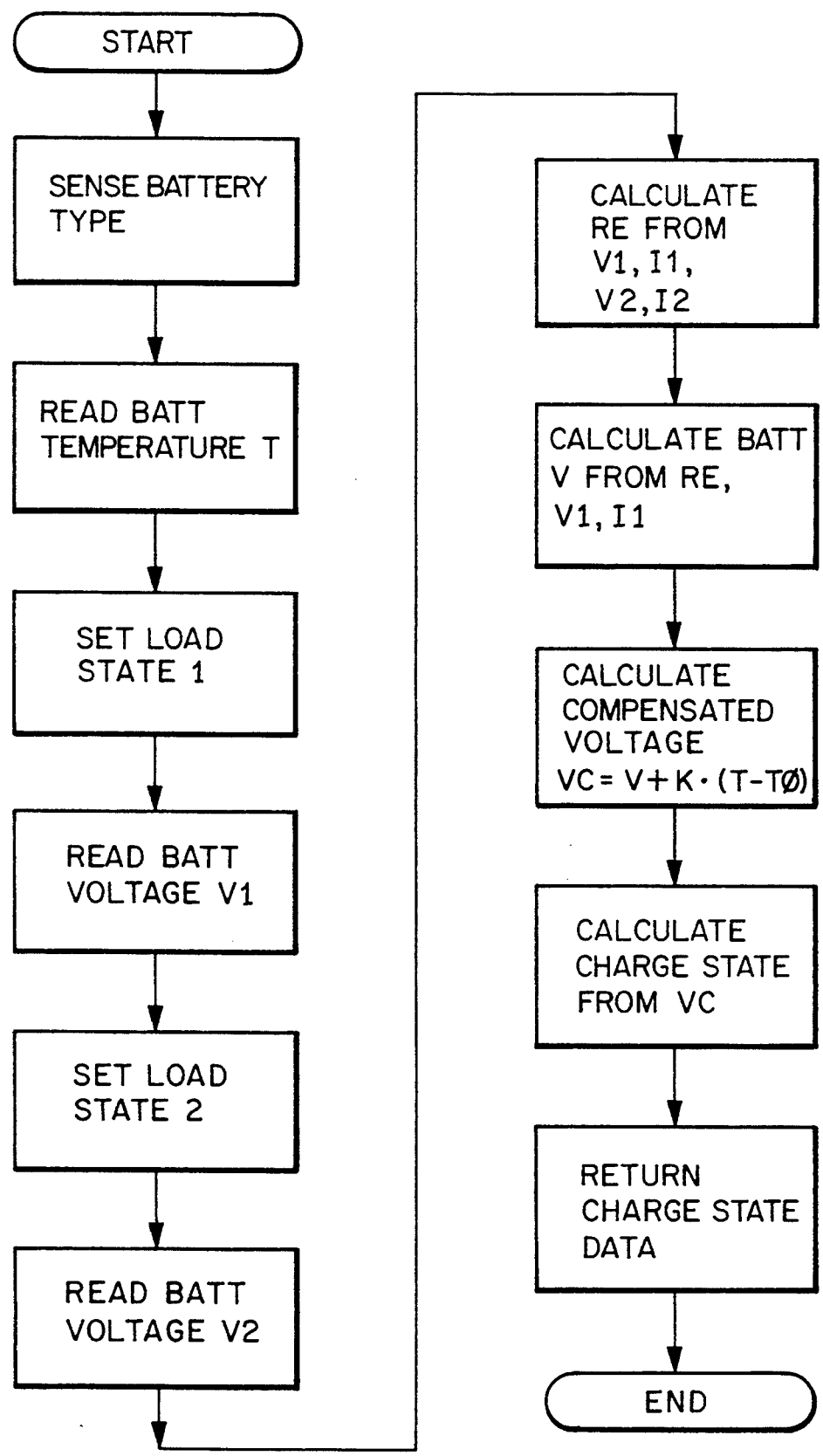
FIG. 6 is a flowchart of the second embodiment of the present invention.

The second embodiment of the invention is shown in FIGS. 5 and 6. The first embodiment shown in FIGS. 2 and 3 uses microprocessor 126 to form a measurement system embedded in battery pack 40. The entire battery pack containing this measurement system is removable. In the second embodiment shown in FIG. 5, replaceable battery pack 250 is a simple structure. Microprocessor 200 is used to make the measurements and computations for battery charge state as well as operate the entire device.

In FIG. 5, microprocessor 200 which is connected to memory 202 and input/output devices 204 and 206 via data and control bus 208 represent a standard computer operated device. Power for the device is supplied by removable battery 250, through power rails 252 and 254. Power from battery 250 is regulated by regulator 256 and filter capacitor 258; regulator 256 should preferably be a high efficiency switching type. Power to memory and input/output devices is switched under control of microprocessor 200 by switches 260 controlled by control lines 262. Switched power on lines 264 allows battery life to be extended by only powering up subsystems 202, 204, and 206 when they are in use.

Sensor 270 is used to sense battery type. The user of the device may wish to switch between types of batteries. For example, in normal daily use a rechargeable nickel-cadmium pack may be used, but in a travel situation where recharging may not be possible, the user may wish to use disposable alkaline cells instead. Different types of batteries have different temperature compensation characteristics. Sensor 270 combined with notches or recesses on battery packs allows microprocessor 200 to determine the type of battery being used and select the compensation constants appropriate for that battery type. Sensor 270 may be a single switch for selecting between two types of batteries, such as alkaline and nickel cadmium, or sensor 270 may be a plurality of switches, allowing a larger number of battery types or capacities to be used.

Temperature sensor 272 is mounted in proximity to the battery pack and measures the battery's temperature. Resistors 274 and field effect transistor switch 276 form a resistive voltage divider for measuring battery voltage. Switch 276 is only turned on during voltage measurements and there is no load from resistors 274 on the battery when no measurement is being made. This current saving increases battery life. Under control of microprocessor 200 via control lines 282, multiplexer 278 selects either the temperature or the voltage analog signal and passes that signal to analog to digital converter 280. Analog to digital converter 280 returns the digital data 284 representing either battery temperature or battery voltage to microprocessor 200. If a temperature dependent resistor is used to measure temperature, the same power saving technique shown for the battery voltage divider as resistors 274 and field effect transistor 276 should be used to insure that a load is placed on the battery only when a measurement is being made.

Determination of battery charge state using the apparatus of FIG. 5 is shown in the flowchart of FIG. 6. Under control of microprocessor 200, battery type is determined by reading sensor 270. Battery type is used to select constants for the calculations. Battery temperature is read from temperature sensor 272.

In the first embodiment of the invention, the series resistance of the battery, $R_e$, was minimized as a source of error by measuring open circuit battery voltage. This second embodiment uses a different approach to correcting for the voltage drop error introduced by series resistance $R_e$. The battery voltage during discharge is measured under a number of different known load currents, and from these voltages and load currents the series resistance $R_e$ and equivalent open circuit battery voltage are derived. The series resistance is calculated as the change in battery voltage divided by the change in the load current.

Figure 7:
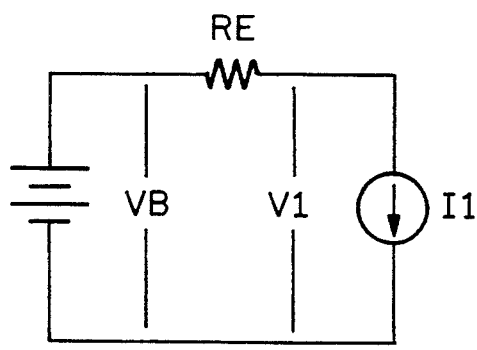
FIG. 7 shows a derivation used in the second embodiment of the present invention.
Figure 7:
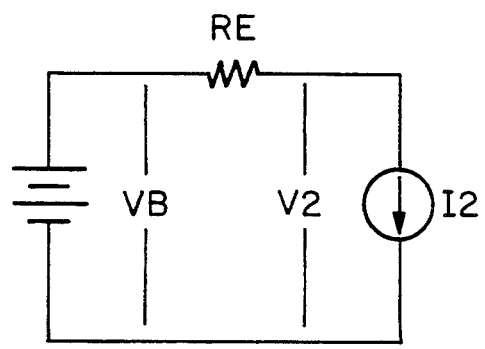

Referring to FIG. 7, the true battery voltage, which is to be determined, is represented as $V_b$. When driving known load current $I_1$ through resistance $R_e$, and measuring voltage $V_1$ across load $I_1$, we have:

$$V_b = V_1 + R_e \cdot I_1 \qquad \text{(Eq. 3)}$$

Similarly, when driving known load current $I_2$ through resistance $R_e$, and measuring voltage $V_2$ across load $I_2$, we have:

$$V_b = V_2 + R_e \cdot I_2 \qquad \text{(Eq. 4)}$$

Combining, $$V_1 + R_e \cdot I_1 = V_2 + R_e \cdot I_2 \qquad \text{(Eq. 5)}$$

Solving for $R_e$:

$$R_e = (V_1 - V_2)/(I_2 - I_1) \qquad \text{(Eq. 6)}$$

Substituting this value for $R_e$ into Equation 4 and solving for $V_b$:

$$V_b = V_2 + I_2 \cdot (V_1 - V_2)/(I_2 - I_1) \qquad \text{(Eq. 7)}$$

Returning to FIGS. 5 and 6, the current loads presented by the different portions of the computer system are measured during the hardware development process. To determine the equivalent series resistance $R_e$ of the battery, and correct the battery voltage reading for this series resistance, microprocessor 200 makes a voltage reading under a known load current state, for example with I/O devices 204 and 206 powered off, makes a second voltage reading in a different known load current state, for example with I/O devices 204 and 206 powered on. Since these load currents have been characterized during the design process, these readings can be used with Eq. 7 to calculate $R_e$ and the corrected battery voltage $V_b$. Using this corrected battery voltage and the battery temperature in Eq. 2, the temperature corrected battery voltage is calculated, and then the charge state is calculated from this corrected voltage, as in the first embodiment. The constants used in Eq. 2 are looked up from a table depending on the battery type as identified by sensor 270.

This two-point measurement approach assumes that the equivalent series resistance $R_e$ is the same over the current range measured. Over a small current range, for example 2 and 10 milliamps, this is accurate. For larger current ranges, it may be advantageous to make more than two measurements and compute an average or a least-squares fit for $R_e$.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential techniques of this invention as defined by the following claims.

What is claimed is:

1. The method of determining the charge state of a battery comprising the steps of:
   measuring the temperature of the battery;
   measuring the open circuit voltage of the battery;
   subtracting a reference temperature value from the measured battery temperature to form a temperature shift;
   multiplying the temperature shift by a temperature shift constant to form a temperature shift voltage;
   adding the temperature shift voltage to the open circuit battery voltage to form the compensated battery voltage; and
   computing the charge state of the battery from the compensated battery voltage.

2. The method of determining the charge state of a battery comprising the steps of:
   identifying the battery type;
   measuring the temperature of the battery;
   taking a plurality of battery voltage measurements under known load currents;
   calculating the voltage drop due to the internal battery series resistance of the battery from the voltage measurements;
   adding the voltage drop due to the internal battery series resistance to the battery voltage to form the equivalent open circuit battery voltage;
   compensating the equivalent open circuit battery voltage by the battery temperature based on the battery type to form a compensated battery voltage; and
   computing the charge state of the battery from the compensated battery voltage.

3. The method of claim 2 where the step of compensating the equivalent open circuit battery voltage by the battery temperature comprises the steps of:

subtracting a reference temperature value from the measured battery temperature to form a temperature shift;

multiplying the temperature shift by a temperature shift constant to form a temperature shift voltage; and adding the temperature shift voltage to the equivalent open circuit battery voltage to form the compensated battery voltage.

4. The method of claim 2 where the step of computing the charge state of the battery from the compensated battery voltage is performed by table look up.

5. The method of claim 2 where the step of measuring the temperature of the battery is performed by measuring the resistance of a temperature dependent resistor.

6. The method of claim 2 where the step of measuring the temperature of the battery is performed by measuring the temperature dependent voltage drop across one or more semiconductor junctions.

* * * * *